(12) United States Patent
Doumae et al.

(10) Patent No.: US 8,031,507 B2
(45) Date of Patent: Oct. 4, 2011

(54) SEMICONDUCTOR MEMORY DEVICE

(75) Inventors: Sumiko Doumae, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 12/510,959

(22) Filed: Jul. 28, 2009

(65) Prior Publication Data

US 2010/0020589 A1 Jan. 28, 2010

(30) Foreign Application Priority Data

Jul. 28, 2008 (JP) ................................. 2008-193133

(51) Int. Cl.
*G11C 11/22* (2006.01)
*G11C 7/02* (2006.01)
(52) U.S. Cl. ........................................ 365/145; 365/207
(58) Field of Classification Search .................. 365/145, 365/207, 210.1
See application file for complete search history.

(56) References Cited

U.S. PATENT DOCUMENTS

| 5,406,510 A * | 4/1995 | Mihara et al. ................ 365/145 |
| 6,026,009 A * | 2/2000 | Choi et al. .................... 365/145 |
| 6,853,600 B2 * | 2/2005 | Itoh ............................ 365/210.1 |

* cited by examiner

*Primary Examiner* — Anh Phung
(74) *Attorney, Agent, or Firm* — Knobbe, Martens, Olson & Bear LLP

(57) ABSTRACT

The sense amplifier detects and amplifies a signal read via bit lines from the ferroelectric capacitor of the memory cell. The dummy capacitor provides a reference voltage to bit lines. The dummy capacitor includes a first dummy capacitor and a second dummy capacitor. The first dummy capacitor is provided with a first dummy plate potential at one end to set the reference voltage to a certain potential. The other end is connected to the bit line. The second dummy capacitor is provided with a second dummy plate potential at one end to fine-tune the reference voltage from the certain potential. The other end thereof is connected to the bit line.

12 Claims, 9 Drawing Sheets

SEMICONDUCTOR MEMORY DEVICE

CROSS REFERENCE TO RELATED APPLICATIONS

This application is based on and claims the benefit of priority from prior Japanese Patent Application No. 2008-193133, filed on Jul. 28, 2008, the entire contents of which are incorporated herein by reference.

BACKGROUND OF THE INVENTION

1. Field of the Invention

The present invention relates to a semiconductor memory device, and, particularly, to the semiconductor memory device using a ferroelectric capacitor.

2. Description of the Related Art

A ferroelectric memory device (FeRAM) is a semiconductor memory device that may store data in a non-volatilile manner based on two different magnitudes of ferroelectric polarization using hysteresis properties of the ferroelectric capacitor.

Generally, memory cells in the conventional ferroelectric memory employ architecture similar to DRAM. That is, a paraelectric capacitor is replaced with a ferroelectric capacitor, and a ferroelectric capacitor and a select transistor are connected in series to form a memory cell (refer to Japanese Patent Laid-Open No. 2001-250376). Such the memory cells are arranged in a grid to form a memory cell array. On reading data or the like, a word line (a select line) of the memory cell to be read is activated, and a select transistor is made conductive, thereby connecting a memory cell to a bit line.

In addition, a so-called TC parallel unit series-connected type ferroelectric memory is also known. This memory is configured by connecting a cell transistor and a ferroelectric capacitor in parallel to form one memory cell, and such memory cells are connected in series to form a memory cell block (refer to JP 2005-4811A). Both in the DRAM-like structure and in the TC parallel unit series-connected type, two methods can be adopted, respectively. One of the methods is called 2-2 transistor-cell method. This method reads complementary data from two memory cells in the dielectric memory (2T2C method). Another one is called 1-1 transistor-cell method (1T1C method). This method uses a single memory cell, and a comparison and amplification of the signal is made with a reference voltage supplied from a dummy capacitor.

A case where a DRAM-like structure is employed is explained herein as an example.

When the 2T2C method is adopted in the DRAM-like structure, a word line connected to a memory cell to be read, and a word lone connected to a complementary memory cell holding a complementary data are selected. Then, the memory cell and the bit line are connected, and the complementary memory cell and the complementary bit line are connected. Thereafter, the plate line voltage is applied to a plate line, thereby applying a voltage to both ends of a ferroelectric capacitor included in the memory cell and the complementary memory cell. The electric charge from the ferroelectric capacitor of the memory cell is read to a bit line, whereas the electric charge from the ferroelectric capacitor of the complementary memory cell is read to a complementary bit line. Then, the potential of these bit line pair is compared and amplified by a sense amplifier.

On the other hand, in the 1T1C method, a word line connected to a memory cell to be read is selected, and the memory cell and the bit line are connected. Then, the plate voltage is applied to a plate line connected to a memory cell, and the voltage is applied to the both ends of a ferroelectric capacitor included in a memory cell. A reference voltage is thereby supplied to a complementary bit line included in bit line pairs from a dummy capacitor. Electric charge from a ferroelectric capacitor is read to a bit line. The potential of the bit line pairs is compared and amplified by a sense amplifier.

Dummy capacitors are usually used in common for plural memory mats activated at the same time in one memory chip. However, an amount of a signal provided from a memory cell may vary among different memory mats. In this case, it is sometimes difficult, with only one dummy capacitor in a memory cell array, to set an adequate reference voltage while maintaining a preferable margin.

SUMMARY OF THE INVENTION

The semiconductor memory device according to one aspect of the present invention comprises: a memory cell array including memory cells arranged therein, each of the memory cells including a cell transistor and a ferroelectric capacitor; a sense amplifier circuit configured to detect and amplify a signal read from the ferroelectric capacitor via a bit line pair; a dummy capacitor configured to provide a reference voltage to the bit line pair; the dummy capacitor further comprising: a first dummy capacitor comprising one end provided with a first dummy plate potential to set the reference voltage to a certain standard voltage, and the other end connectable to the bit line pair; and a second dummy capacitor comprising one end provided with a second dummy plate potential to fine-tune the reference voltage from the standard potential, and the other end connectable to the bit line pair.

DETAILED DESCRIPTION OF THE EMBODIMENTS

Embodiments of the present invention will be explained with reference to the drawings.

First Embodiment

Figure 1:
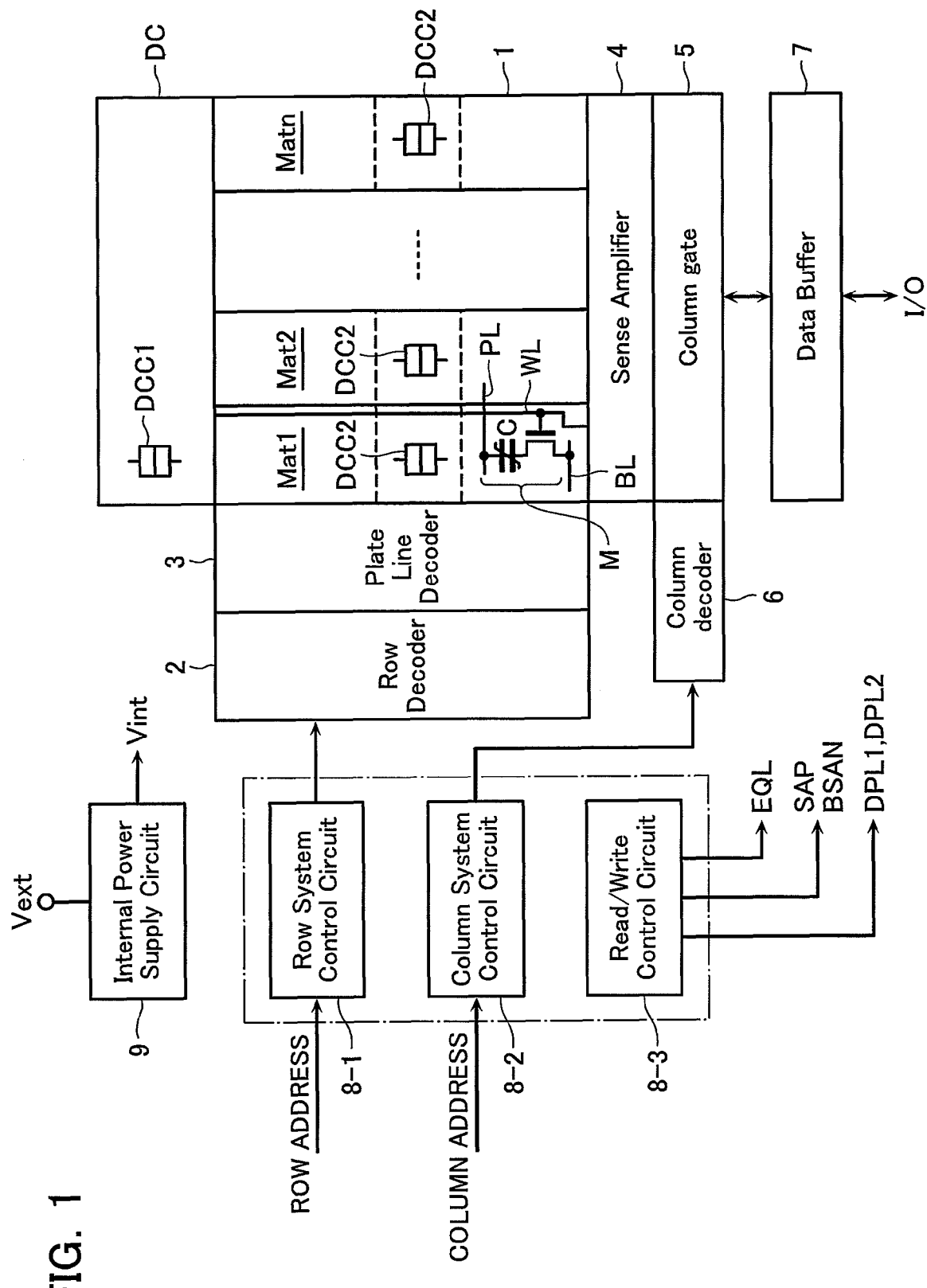
FIG. 1 is a block diagram showing the entire structure of the semiconductor memory device according to the first embodiment of the present invention.

FIG. 1 shows a block diagram of the ferroelectric memory according to the first embodiment.

A memory cell array 1 is configured by arranging memory cells M each comprising a ferroelectric capacitor C and a select transistor T. The memory cell M is arranged at intersections of word lines WL, plate lines PL and bit lines BL. A row decoder 2 selectively drives the word lines WL in the memory cell array 1. A plate line decoder 3 selectively drives the plate lines PL. Also, a sense amplifier 4 is provided for differentially amplifying a read voltage read from the memory cell M to the bit line BL. A column gate 5 is provided for selectively connecting the bit line BL to a data line. A column decoder 6 is provided as a circuit for controlling selective drive of the column gate 5.

In addition, as a circuit for temporarily holding data read to the data line, a data buffer 7 is provided. Moreover, a control circuit 8 controls reading and writing of the memory cell array 1.

The control circuit 8 has a row system control circuit 8-1, a column system control circuit 8-2 and a read/write control circuit 8-3. The row system control circuit 8-1 receives a row address, and controls the row decoder 2 and plate line decoder 3. The column system control circuit 8-2 receives a column address, and controls the column decoder 6. The read/write control circuit 8-3 generates a bit line equalization signal EQL, sense amplifier activation signals SAP, BSAN, and dummy plate potentials DPL1 and DPL2. Also, the internal power supply circuit 9 is provided with an outer power supply voltage Vext and generates an internal power supply voltage Vint.

The internal power supply circuit 9 may include a voltage boosting circuit for generating a step-up voltage as needed.

Note that the memory cell array 1 includes a plurality of memory mats Matj (j=1-n). One memory mat Matj includes redundancy cell (not shown) to retain redundant data as well as a plurality of memory cells M. The memory mat Matj is an example from which data is read in a batch.

Figure 2:
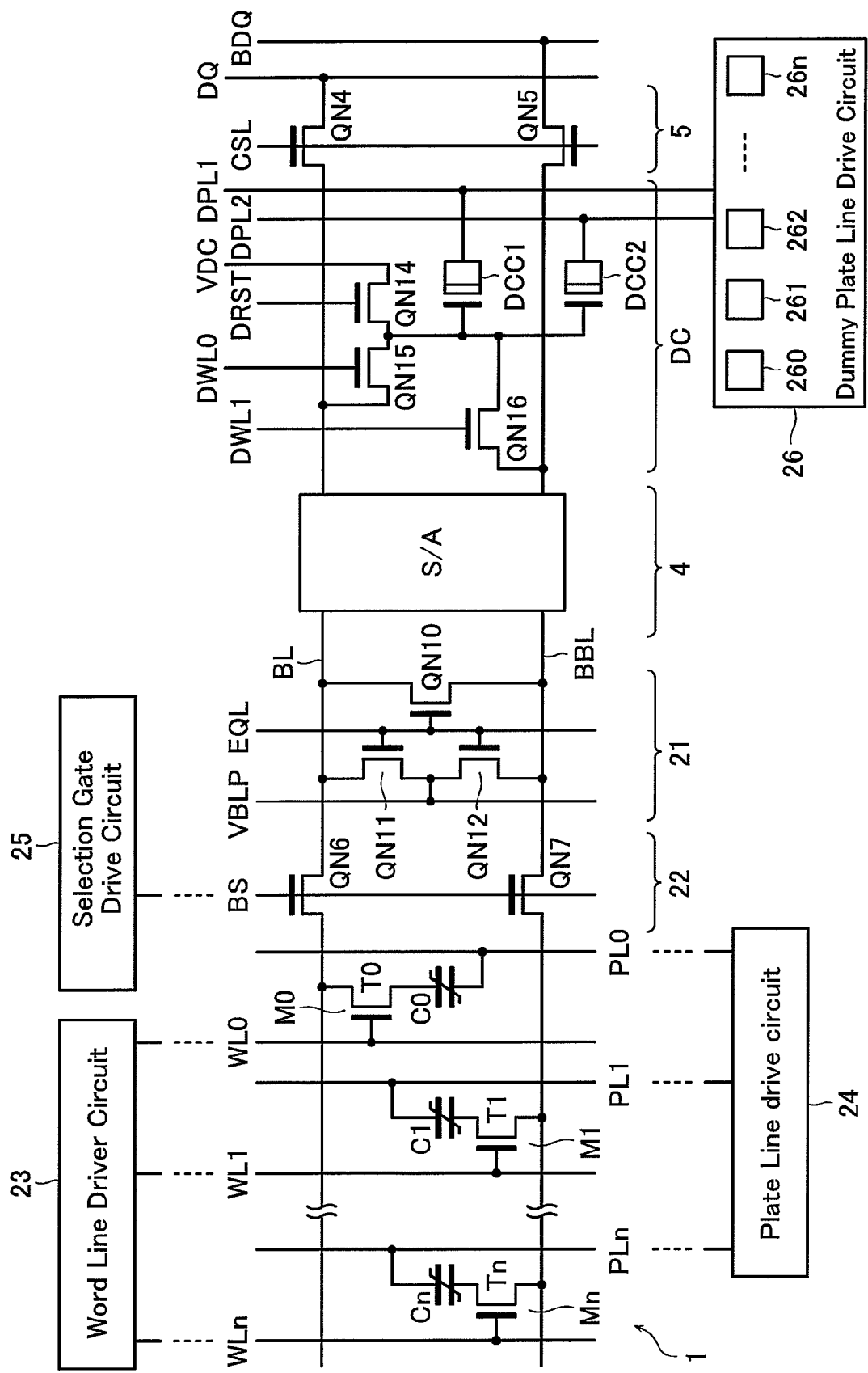
FIG. 2 is a circuit diagram illustrating one pair of bit lines BL, BBL in the memory cell array 1 shown in FIG. 1.
Figure 3:
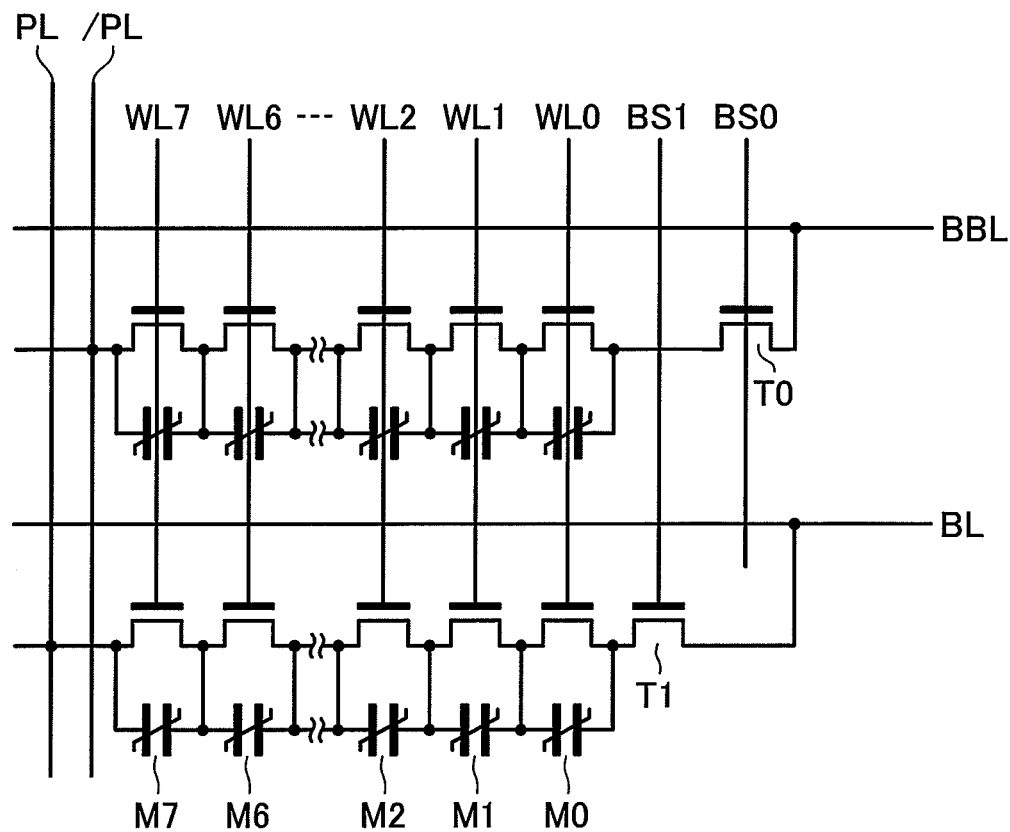
FIG. 3 is a circuit diagram showing the another structure example of the memory cell array 1 (TC parallel unit series connection model).

As shown in FIG. 2, the memory cell array 1 include a pair of complementary bit lines BL, BBL. Here, an example having a structure similar to DRAM is shown. That is, a memory cell Mi (i=1-n) is formed by connecting one select transistor Ti and one ferroelectric capacitor Ci in series. As shown in FIG. 3, instead of such a DRAM-like structure, a so-called "TC parallel unit series-connected type" memory may be employed. Specifically, a transistor and a capacitor are connected in parallel to form a memory cell M. Furthermore, a plurality of such the memory cells M (in FIG. 3, eight) are connected in series to form a chain. The ferroelectric memory of this "TC parallel unit series-connected type" sets all word lines WL at "H" in a standby state, to keep the ferroelectric capacitors in a short-circuit state. On the other hand, when it performs reading or writing, the selected word line is set at "L".

In the case of FIG. 2, one end of the select transistor Ti is connected to the bit line BL or BBL, and its gate is connected to a word line WLi. A terminal (a plate electrode) of the ferroelectric capacitor Ci is connected to a plate line PLi.

The row decoder 2 includes a word line driver circuit 23 for driving word lines WLi. The plate line decoder 3 includes a plate line drive circuit 24 for driving plate lines PLi. The bit lines BL and BBL are separated by NMOS transistors QN6 and QN7 formed in a selection gate 22. These transistors QN6 and QN7 are formed between the memory cell array 1 and the sense amplifier circuit 4. The selection gate 22 is ON/OFF-controlled by a selection signal from a selection gate drive circuit 25.

The bit lines BL and BBL are provided with an equalizing circuit 21 and a sense amplifier circuit 4 outside the selection gate 22. Details of the structure of the sense amplifier circuit 4 will be described below.

The equalizing circuit 21 comprises an equalizing NMOS transistor QN10 for short-circuiting the bit lines BL and BBL, and precharge NMOS transistors QN11 and QN12 both of which are connected at one end to the bit lines BL and BBL, respectively. The gates of these transistors are controlled in common by equalizing signal EQL.

Also, a dummy cell DC is provided to generate a reference voltage Vref. This reference voltage Vref is the voltage for comparison with the voltage read from a memory cell M to the bit line BL or BBL. The dummy cell DC comprises a reset transistor QN14, select transistors QN15, QN16, a first dummy capacitor DCC1 and a second dummy capacitor DCC2.

The first dummy capacitor DCC1 is shared by a plurality of the memory mats Matj, which is not illustrated in the figures. That is, a single piece of the first dummy capacitor DCC1 is provided for a plurality of the memory mats Matj.

On the other hand, the second dummy capacitor DCC2 according to this embodiment is provided for a single memory mat Mat (refer to FIG. 1). Also, the second dummy capacitor DCC2 has a capacitance smaller than that of the first dummy capacitor DCC1. Note that this dummy capacitors DCC1 and DCC2 may be formed of a paraelectric capacitor. But it may be formed of a ferroelectric capacitor, like the memory cell M. Also, the dummy capacitors DCC1 and DCC2 may be formed of a plurality of ferroelectric capacitors or paraelectric capacitors connected in series or parallel.

The select transistor QN15 is connected between the bit line BL and one end of the first dummy capacitor DCC1. The select transistor QN16 is connected between the bit line BBL and one end of the first dummy capacitor DCC1. Also, the dummy word lines DWL0 and DWL1 are connected to a gate of the select transistors QN15 and QN16, respectively. Potentials on the dummy word lines DWL0 and DWL1 are controlled by the row decoder 2. Also, one end of the reset transistor QN14 is connected to one end of the dummy capacitor DCC1 and DCC2, and the other end thereof is provided with the reference voltage VDC. Thereby, one end of the dummy capacitor DCC1 and DCC2 are reset to the reference voltage VDC, when the reset signal DRST becomes "H".

The second dummy capacitor DCC2 is connected in parallel with this first dummy capacitor DCC1. Another end of first dummy capacitor DCC1 is given a dummy plate potential DPL1, while another end of second dummy capacitor DCC2 is given a dummy plate potential DPL2. The dummy plate potentials DPL1 and DPL2 are provided from a dummy plate line drive circuit 26. The read/write control circuit 8-3 includes the dummy plate line drive circuit 26. The dummy plate potential DPL1 is commonly provided to a plurality of the memory mats Mati. On the other hand, the dummy plate potential DPL2 is set at different values for different memory mats Mati.

The dummy plate line drive circuit 26 comprises a first dummy plate line drive circuit 260 shared by the plural memory mats Matj, and "n" second dummy plate line drive circuits 261, 262, . . . 26n provided corresponding to the number n of the memory mats Mati.

The value of the dummy plate potential DPL1 is set in the first dummy plate line drive circuit 260 according to a result of a memory test. Also, the dummy plate potential DPL2 is set to different values among different memory mats Mati, by the second dummy plate line drive circuit 261, 262, . . . 26n, according to characteristic variation between the memory mats Matj. The characteristic variation is known or turned out through a memory test.

The first dummy capacitor DCC1 provided commonly to the plural memory mats Matj allows a rough or overall adjustment of the reference voltage Vref provided to the plural memory mats Matj. Also, the plural second dummy capacitors DCC2 each provided for one memory mat Matj allows the reference voltage Vref to be fine-tuned per memory mat Matj, to absorb the characteristic variation or difference of the memory mats Matj. This fine-tune adjustment is conducted by the second dummy plate line drive circuits 261, 262, . . . 26n, as described below.

The first dummy capacitor DCC1 has a size larger than the second dummy capacitor DCC2. Since the first dummy capacitor DCC1 is provided in common to the plural memory mats Matj, it does not increase the memory chip area. Also, the second dummy capacitor DCC2 is provided for a memory mat Matj, in a plurality. However, since the second dummy capacitor DCC2 serves to fine-tune the reference voltage Vref per memory mat Matj, it may be smaller in size than the first dummy capacitor DCC1. Thus, according to the structure of this embodiment, the area of the dummy capacitor may be downsized, and the reference voltage Vref can be fine-tuned per memory mat. That is, it is possible to set a larger margin of the reference voltage Vref, and reduce reading errors or the like, while avoiding the increase of the memory area.

The explanation returns to FIG. 2. The bit lines BL and BBL are connected to data lines DQ and BDQ through NMOS transistors QN4 and QN5 that configures a column gate 5. The column gate 5 is controlled by the column decoder 6 (refer to FIG. 1). Read data are output through the data buffer 7 to an I/O terminal. Write data provided through the I/O terminal is transferred to the sense amplifier circuit 4 in the column selected by the column gate 5, through the data buffer 7, thereby writing to a selected memory cell in memory cell array 1 being conducted.

Figure 4:
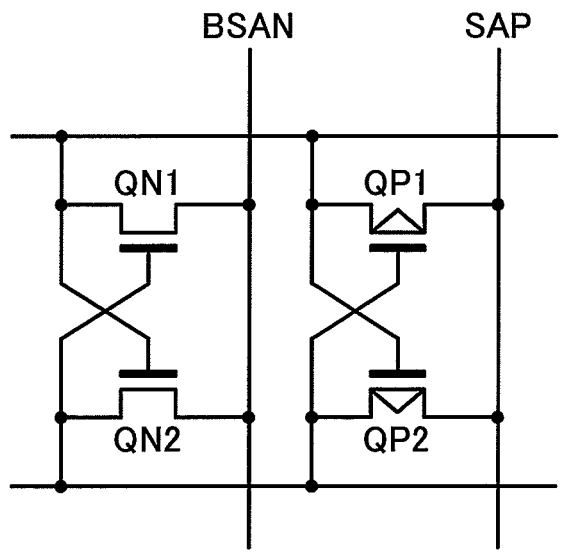
FIG. 4 is a circuit diagram showing the details of the structure of the sense amplifier circuit 4 shown in FIG. 1.

Next, the structure of the sense amplifier circuit 4 is explained in detail with reference to FIG. 4. The sense amplifier circuit 4 comprises an NMOS flip-flop including NMOS transistors QN1 and QN2, as well as a PMOS flip-flop including PMOS transistors QP1 and QP2, as shown in FIG. 4. The operations of the NMOS flip-flop and the PMOS flip-flop are controlled by the sense-amplifier enable signal BSAN and SAP, respectively.

PMOS transistors QP1 and QP2 that configures the PMOS flip-flop are connected in series between the bit lines BL and BBL. Each of these transistors has a gate connected to the bit lines BL and BBL, respectively, to form a flip-flop circuit. Also, NMOS transistors QN1 and QN2 that configures the NMOS flip-flop are connected in series between the bit lines BL and BBL. Each of these transistors have a gate connected to the bit line BBL and BL, respectively.

Figure 5:
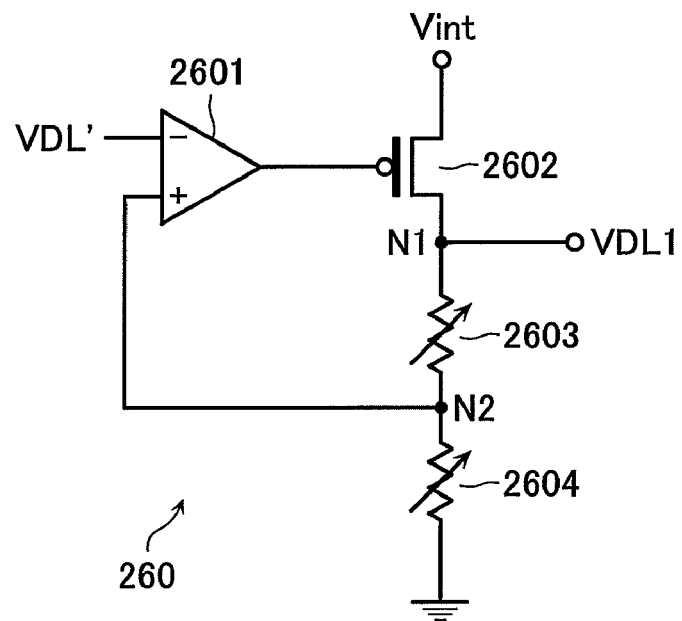
FIG. 5 is a circuit diagram showing the structure example of the first dummy plate line drive circuit 260.

An exemplified structure of the above-described first dummy plate line drive circuit 260 is shown in FIG. 5.

This first dummy plate line drive circuit 260 includes an operational amplifier 2601, PMOS transistor 2602, variable resistors 2603 and 2604. An output terminal of the operational amplifier 2601 is connected to a gate of the Ptype MOS transistor 2602. The p type MOS transistor 2602 have a source provided with an internal power supply potential Vint, and a drain (a node N1) connected to one end of the variable resistor 2603. The variable resistor 2603 and 2604 are serially connected between the node N1 and a ground terminal. Also, the node N2 between the variable resistors 2603 and 2604 receives a feedback from a non-inverting input terminal of the operational amplifier 2601.

Also, an input potential VDL' is supplied to an inverting input terminal of the operational amplifier 2601. The dummy plate potential VPL1 is adjusted by adjusting the resistance of the variable resistor 2603 and 2604 according to the result of the memory test.

Figure 6:
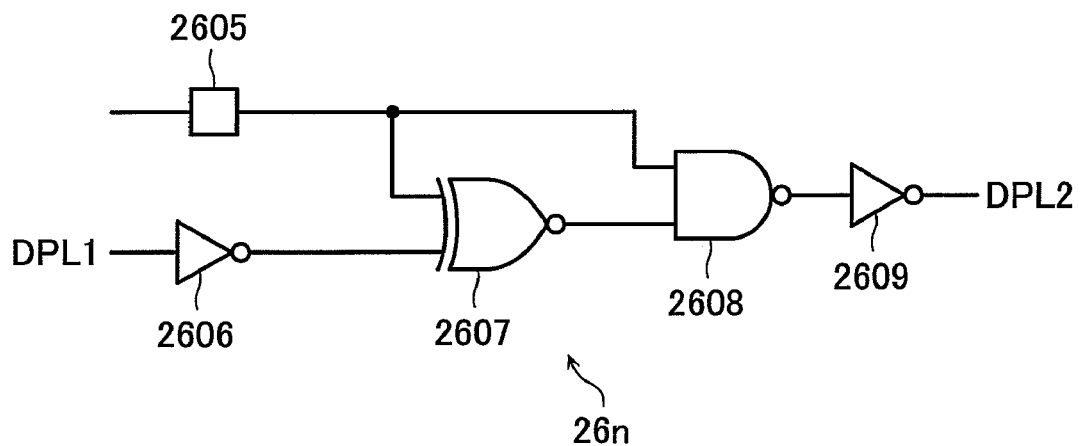
FIG. 6 is a circuit diagram showing the structure example of the second dummy plate line drive circuits 261-261$n$.

An exemplified example of the above-described second dummy plate line drive circuit 261-261n is shown in FIG. 6. Since all of the second dummy plate line drive circuits 261-261n may employ the same structures, FIG. 6 merely illustrates one of them.

The dummy plate line drive circuit 261-26n may comprise a fuse circuit 2605, an inverter 2606, an EXOR gate 2607, a NAND gate 2608, and an inverter 2609. The fuse circuit 2605 outputs "H" when the reference voltage Vref is needed to be higher, and in contrast, outputs "L" when the reference voltage Vref is needed to be smaller. The fuse circuit 2605 is set according to the result of the memory test conducted before shipment of the memory unit.

The inverter 2606 is supplied with a dummy plate potential DPL1 at its input terminal, and the output terminal thereof is connected to one of the input terminals of the EXOR gate 2607. An output terminal of the fuse circuit 2605 is connected to the other input terminal of the EXOR gate 2607. Also, the output terminal of the EXOR gate 2607 is connected to one of input terminals of the NAND gate 2608. An output terminal of the fuse circuit 2605 is connected to the other input terminal of the NAND gate 2608. The inverter 2609 has an input terminal connected to an output terminal of the NAND gate 2608. An output signal of the inverter 2609 is dealt as the dummy plate potential DPL2.

Having such a structure, the second dummy plate line drive circuit 261-26n may switch the dummy plate potential DPL2 to either one of following (1)-(3):

(1) a signal having the same phase (an in-phase signal) as the dummy plate potential DPL1;

(2) an inverted signal of the dummy plate potential DPL1; and (3) A signal fixed to "L" level (a ground potential).

In case (1), the reference voltage Vref may be set at a value larger than the standard voltage Vref0.

In case (2), the reference voltage Vref may be set at a value smaller than the standard voltage Vref0.

In case (3), the reference voltage Vref may be equal to the standard voltage Vref0.

In this way, the second dummy plate line drive circuit 261-26n have a function of fine-tuning the reference voltage Vref to different values for every memory mat Matj.

Figure 7:
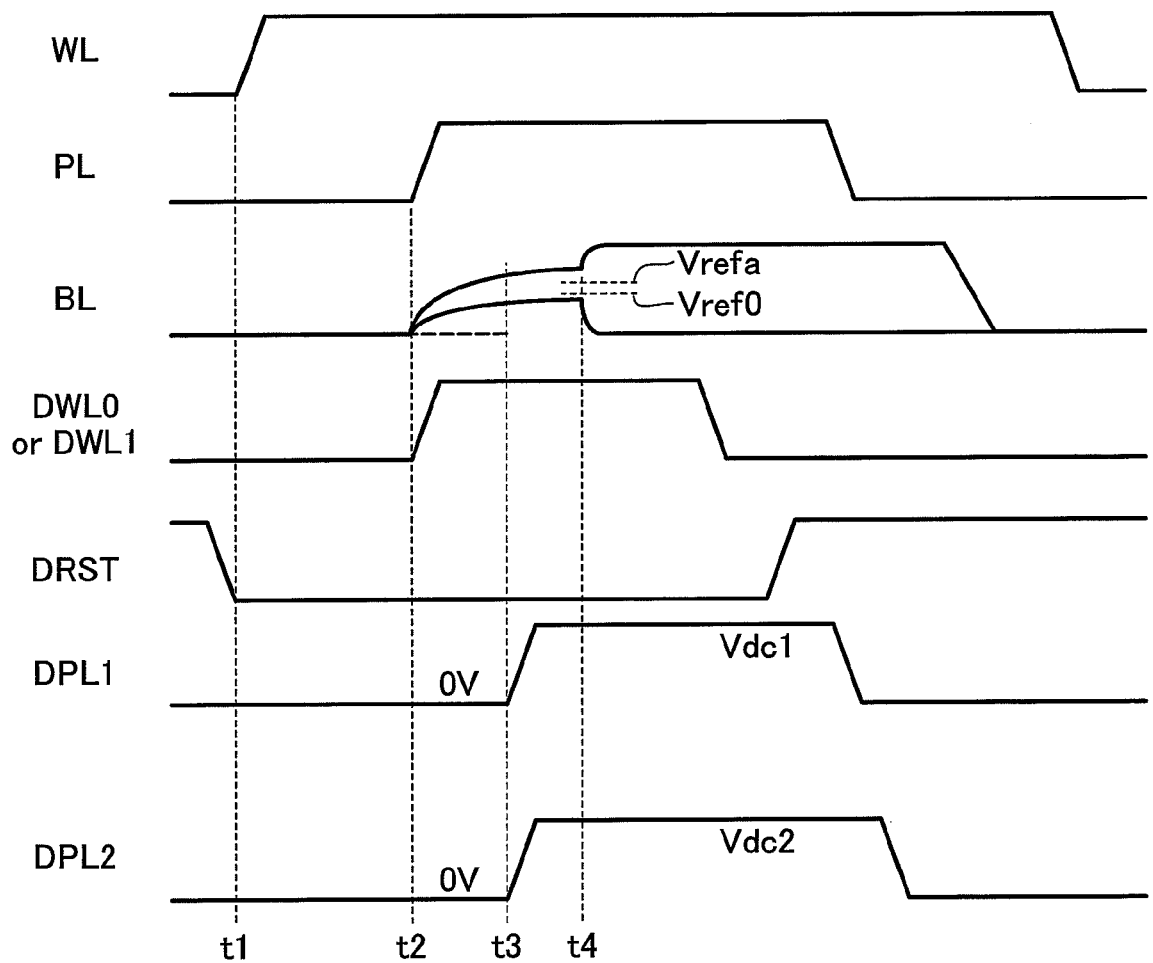
FIG. 7 is a timing chart showing operation of the first embodiment of the present invention.
Figure 8:
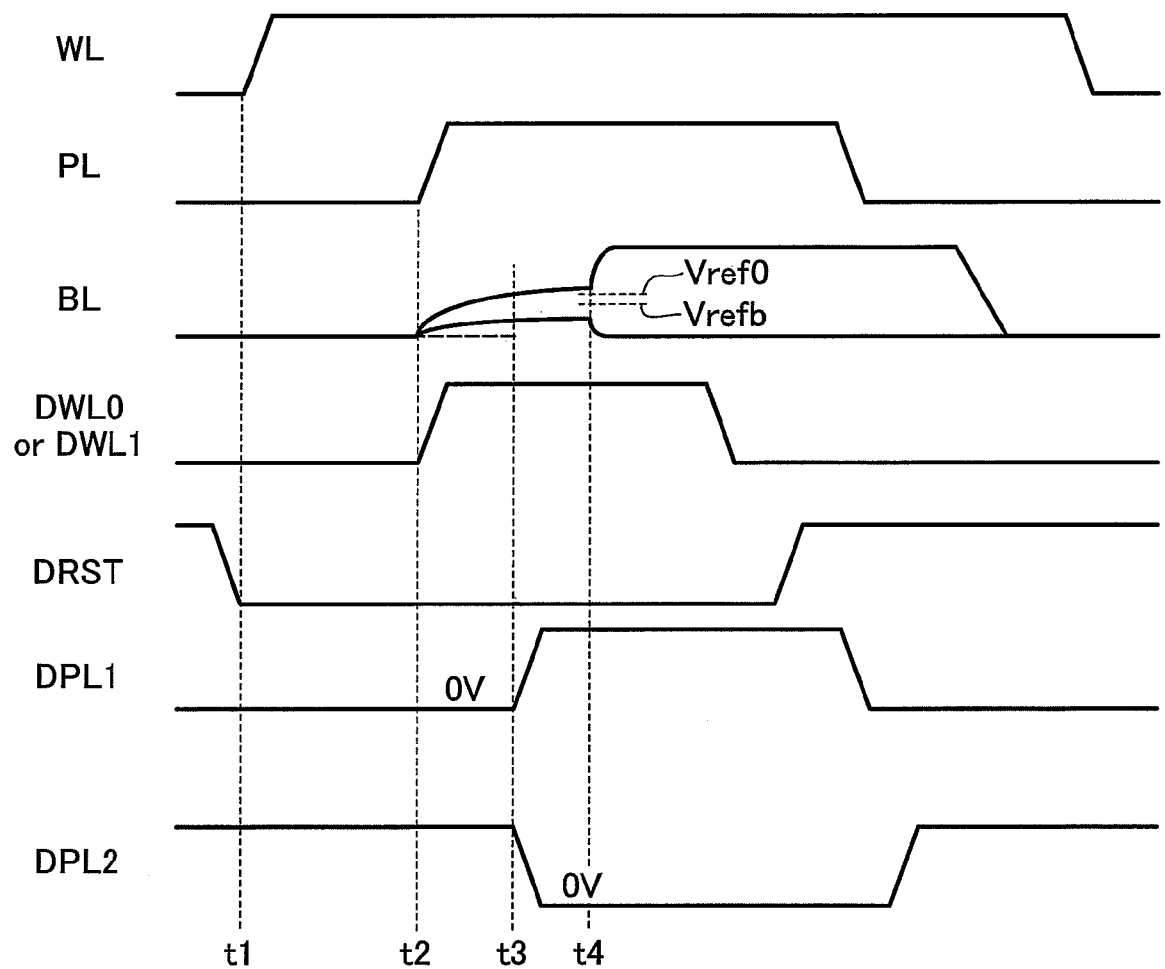
FIG. 8 is a timing chart showing operation of the first embodiment of the present invention.
Figure 9:
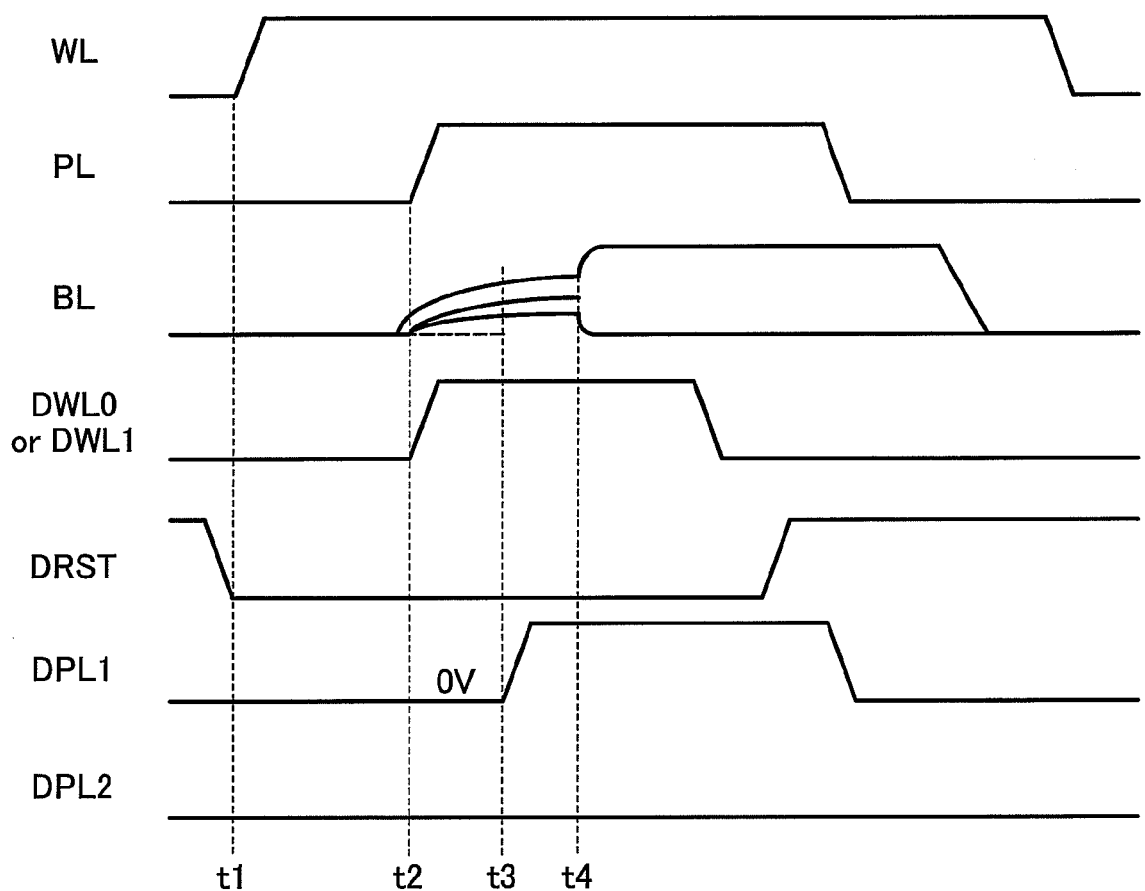
FIG. 9 is a timing chart showing operation of the first embodiment of the present invention.

Then, operation of the embodiment is described with reference to a timing chart of FIG. 7-FIG. 9.

Firstly, above-described case (1) is explained with reference to FIG. 7. Specifically, the dummy plate potential DPL2 is set at a signal having the same phase as the dummy plate potential DPL1, the reference voltage Vref is set at a value larger than the standard voltage Vref0.

At first, at time t1, the potential of the word line WL connected to a memory cell M as a reading target rises to "H" from "L". In this case, a case is explained as an example in which a memory cell M connected to the bit line BL is dealt as a read target. At the same time, the reset signal DRST is changed to "L" from "H", thereby terminating pre-charge operation of the dummy cell DC.

Then, at time t2, the potential of the plate line PL connected to the memory cell M as a read target rises to "H" from "L". In addition, the dummy word line DWL0 or DWL1 (in this case, DWL1) rises to "H" from "L". Furthermore, at time t3, the dummy plate potential DPL1 rises from 0V to a predetermined potential Vdc1. At the same time, the dummy plate potential DPL2 rises from 0V to a predetermined potential Vdc2. Then, at time t4, the sense amplifier 4 is activated, thereby reading operation being performed.

In this way, the dummy plate potential DPL2 is provided as a signal having the same phase as the dummy plate potential DPL1. This makes the reference voltage Vref have a value Vrefa larger than the reference voltage Vrefo. When it is determined that, as a result of memory test, the reference potential Vref is slightly biased toward the data "0" distribution, it is possible to perform an operation as illustrated in FIG. 7, thereby obtaining a large read margin.

Next, above-described case (2) is explained with reference to FIG. 8. Specifically, the dummy plate potential DPL2 is set at a signal having the reversed phase of the dummy plate potential DPL1, the reference voltage Vref is set at a value smaller than the standard voltage Vref0.

That is, the dummy plate potential DPL1 changes from "L" to "H" at time t3. On the other hand, the dummy plate potential DPL2 changes from "H" to "L" at time t3. This allows the reference voltage Vref to have a value Vrefb lower than the reference voltage Vrefo. When it is determined that, as a result of memory test, the reference potential Vref is slightly biased toward the data "1" distribution, it is possible to perform an operation as illustrated in FIG. 8, thereby obtaining a large read margin.

Next, above-described case (3) is explained with reference to FIG. 9. Specifically, the dummy plate potential DPL2 is set at a signal fixed to "L", thereby keeping the reference voltage Vref equal to the standard voltage Vref0. That is, the dummy plate potential DPL1 varies from "L" to "H" at time t3, while the dummy plate potential DPL2 is kept at "L" at all times. This allow the reference voltage Vref to be equal to the standard voltage Vref0 that is determined by a size of the dummy plate potential DPL1. When it is determined that, as a result of memory test, the reference voltage Vref is not biased either to the data "1" distribution or to the data "0" distribution, but positioned almost at the center of the two distributions, operation shown in FIG. 9 may be performed.

Second Embodiment

Figure 10:
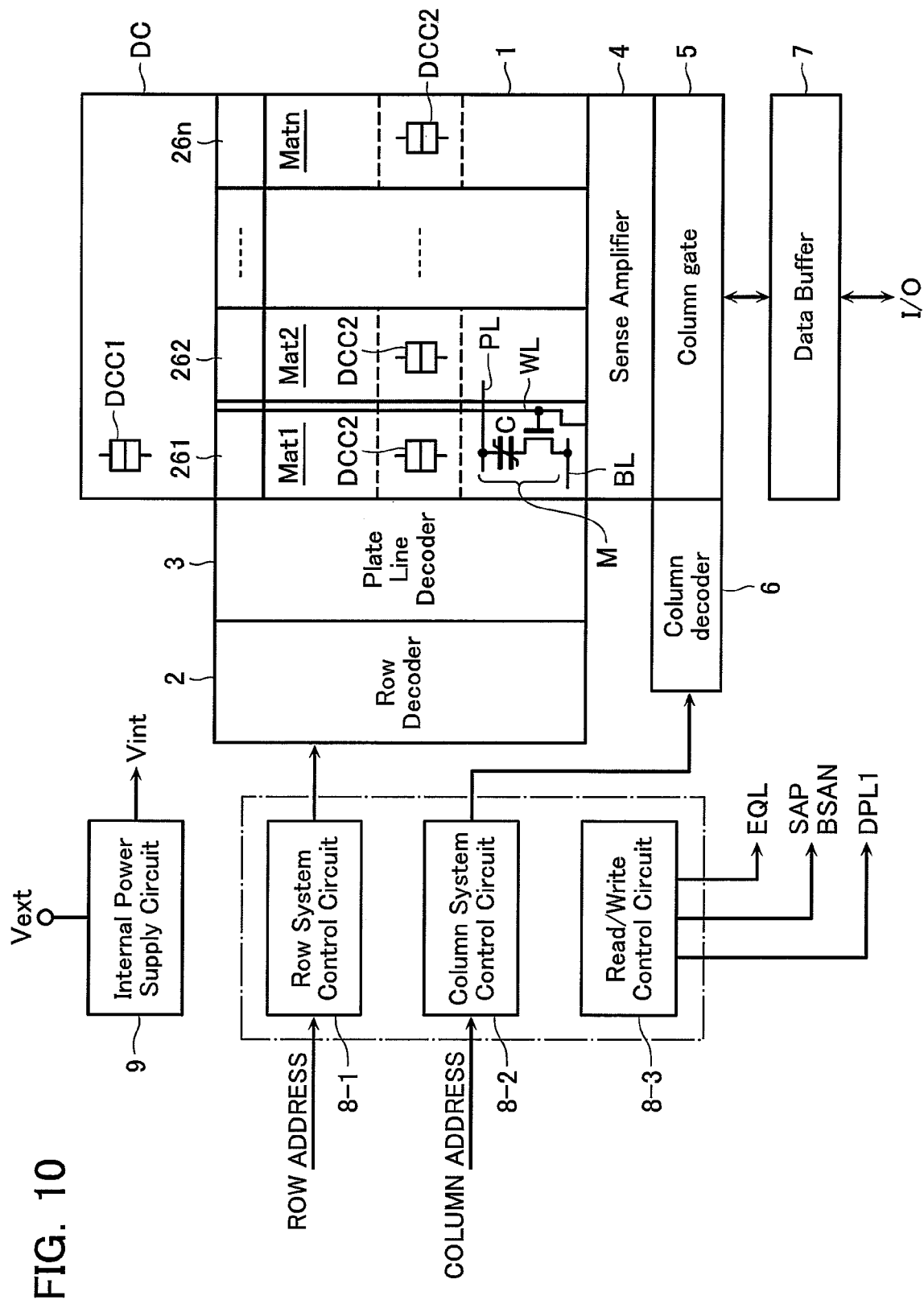
FIG. 10 is a block diagram showing the entire structure of the semiconductor memory device according to the second embodiment of the present invention.

Next, the second embodiment of the present invention is described with reference to FIG. 10.
The same reference numerals are used in FIG. 10 for the components that are the same as those of the first embodiment, and the explanation about the details thereof are omitted hereinbelow.

This second embodiment is different from the first embodiment in that the second dummy plate line drive circuit 261-26n in the dummy plate line drive circuit 26 is formed in the corresponding the memory mats Matj, respectively. The other structures are similar to that of the first embodiment.

Third Embodiment

Figure 11:
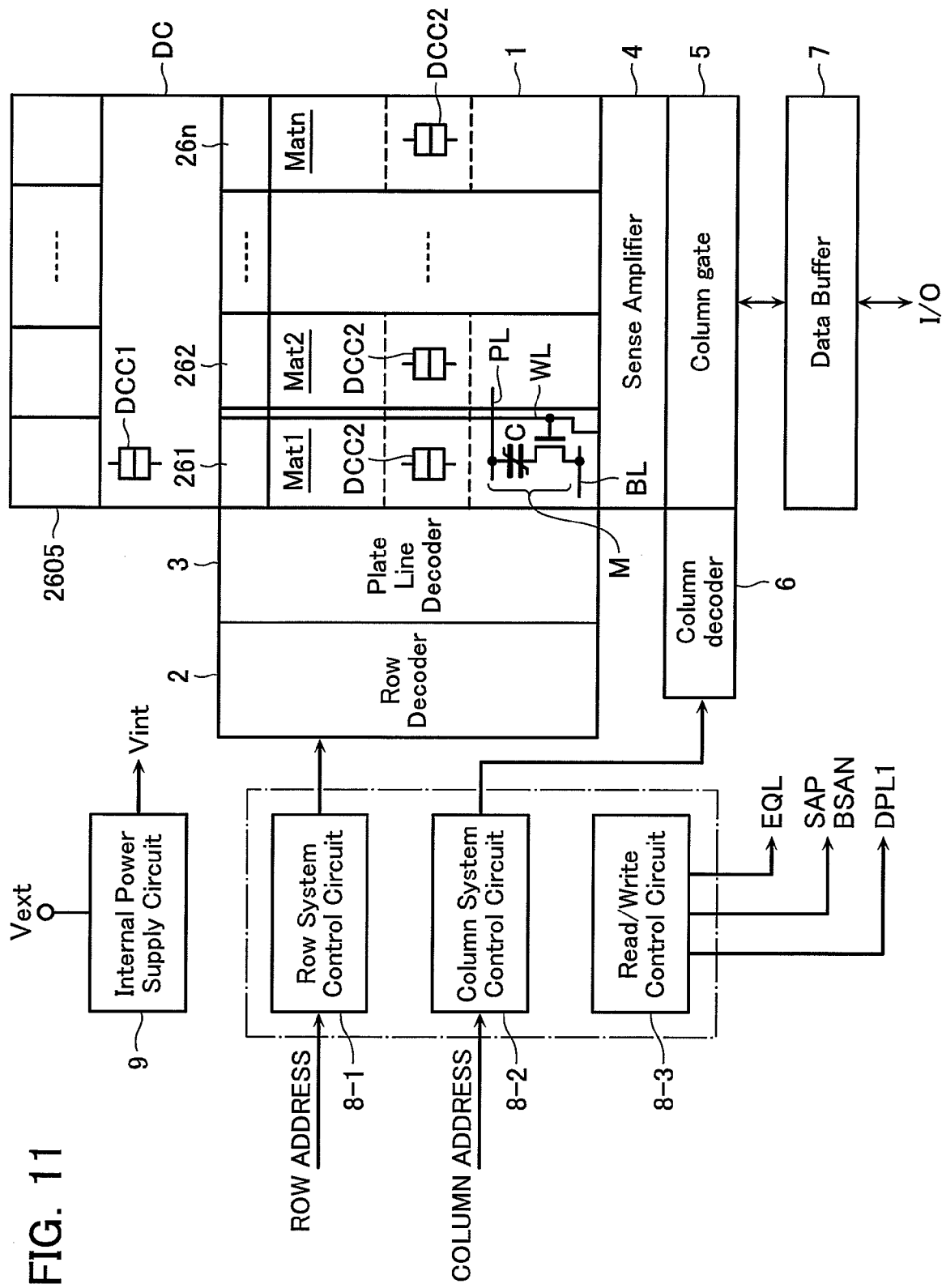
FIG. 11 is a block diagram showing the entire structure of the semiconductor memory device according to the third embodiment of the present invention.

Next, the third embodiment of the present invention is described with reference to FIG. 11.
The same reference numerals are assigned to the same components as those of the first embodiment in FIG. 11, and detailed explanations thereof are omitted hereinbelow.

The third embodiment is the same as the second embodiment in that the second dummy plate line drive circuit 261-26n in the dummy plate line drive circuit 26 are each formed in the corresponding memory mats Matj, respectively. However, the third embodiment is different from the second embodiment in that the fuse circuit 2605 as a component of the second dummy plate line drive circuit 261-26n is drawn out to the external of the memory cell array 1. The other structures are similar to the second embodiment.

[Others]

Having explained the embodiments of the present invention, the present invention is not limited to them. Various variations, substitution, deletion, addition and the like are possible without departing from the spirit of the present invention. For example, in the above-described embodiments, the second dummy capacitor DCC2 is explained as being provided for a memory mat Matj. However, the present invention is not limited to this example. A single piece of the second dummy capacitor may be shared by the plural memory mats Matj. Also, a plurality of the second dummy capacitors DCC2 may exist in one memory mat Matj.

What is claimed is:

1. A semiconductor memory device comprising:
    a memory cell array comprising memory cells, each of the memory cells comprising a cell transistor and a ferroelectric capacitor;
    a sense amplifier circuit configured to detect and amplify a signal read from the ferroelectric capacitor via a bit line pair; and
    a dummy capacitor configured to provide a reference voltage to the bit line pair, the dummy capacitor further comprising:
        a first dummy capacitor comprising a first end with a first dummy plate potential configured to set the reference voltage to a predetermined voltage, and a second end configured to connect to the bit line pair; and
        a second dummy capacitor comprising a first end with a second dummy plate potential configured to fine-tune the reference voltage from the predetermined voltage and a second end configured to connect to the bit line pair,
        wherein a capacitance of the first dummy capacitor is larger than a capacitance of the second dummy capacitor.

2. The semiconductor memory device of claim 1, wherein the dummy capacitor is a paraelectric capacitor.

3. The semiconductor memory device of claim 2, wherein the second dummy capacitor is provided per batch portion from which data is read; and
the first dummy capacitor is shared by a plurality of the batch portions.

4. The semiconductor memory device of claim 3, wherein a fuse circuit for adjusting the second dummy plate potential is provided per batch portion from which data is read.

5. The semiconductor memory device of claim 1, wherein the second dummy capacitor is provided per batch portion from which data is read; and
the first dummy capacitor is shared by a plurality of the batch portions.

6. The semiconductor memory device of claim 1, wherein a fuse circuit for adjusting the second dummy plate potential is provided per batch portion from which data is read.

7. The semiconductor memory device of claim 1, further comprising:
    a first dummy plate line drive circuit configured to supply the first dummy plate potential to the first dummy capacitor; and
    a second dummy plate line drive circuit configured to supply the second dummy plate potential to the second dummy capacitor.

8. The semiconductor memory device of claim 7, wherein
the second dummy plate line drive circuit is provided per batch portion from which data is read; and
the first dummy plate line drive circuit is shared by a plurality of the batch portions.

9. The semiconductor memory device of claim 8, wherein the second dummy plate line drive circuit comprises a fuse circuit for adjusting the second dummy plate potential.

10. The semiconductor memory device of claim 9, wherein the fuse circuit is located outside of the memory cell array.

11. The semiconductor memory device of claim 7, wherein the second dummy plate line drive circuit is configured to switch the second dummy plate potential to either:
a signal having the same phase as the first dummy plate potential;
a reversed signal of the first dummy plate potential; or
a ground potential.

12. The semiconductor memory device of claim 7, wherein the dummy capacitor comprises a paraelectric capacitor.

* * * * *